(12) United States Patent
Jakubowski et al.

(10) Patent No.: US 8,455,960 B2
(45) Date of Patent: Jun. 4, 2013

(54) HIGH PERFORMANCE HKMG STACK FOR GATE FIRST INTEGRATION

(75) Inventors: Frank Jakubowski, Dresden (DE); Peter Baars, Dresden (DE); Till Schloesser, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2 days.

(21) Appl. No.: 13/185,112

(22) Filed: Jul. 18, 2011

(65) Prior Publication Data

US 2013/0020656 A1      Jan. 24, 2013

(51) Int. Cl.
*H01L 29/00*    (2006.01)
(52) U.S. Cl.
USPC .......................... 257/413; 257/310; 257/412
(58) Field of Classification Search
USPC .......................................... 257/310, 412, 413
See application file for complete search history.

(56) References Cited

U.S. PATENT DOCUMENTS

| 7,993,995 | B2 * | 8/2011 | Majumdar et al. | 438/198 |
| 2005/0098808 | A1 * | 5/2005 | Moon | 257/295 |
| 2011/0121410 | A1 * | 5/2011 | Liu et al. | 257/412 |
| 2011/0260255 | A1 * | 10/2011 | Wang et al. | 257/368 |

* cited by examiner

*Primary Examiner* — Julio J Maldonado
*Assistant Examiner* — Jaehwan Oh
(74) *Attorney, Agent, or Firm* — Ditthavong Mori & Steiner, P.C.

(57) ABSTRACT

Semiconductor devices are formed with a silicide interface between the work function layer and polycrystalline silicon. Embodiments include forming a high-k/metal gate stack by: forming a high-k dielectric layer on a substrate, forming a work function metal layer on the high-k dielectric layer, forming a silicide on the work function metal layer, and forming a poly Si layer on the silicide. Embodiments include forming the silicide by: forming a reactive metal layer in situ on the work function layer, forming an a-Si layer in situ on the entire upper surface of the reactive metal layer, and annealing concurrently with forming the poly Si Layer.

19 Claims, 2 Drawing Sheets

HIGH PERFORMANCE HKMG STACK FOR GATE FIRST INTEGRATION

TECHNICAL FIELD

The present disclosure relates to gate first high-k/metal gate (HKMG) stack fabrication. The present disclosure is particularly applicable to semiconductor devices in 32 nanometers (nm) and 28 nm technology nodes, and beyond.

BACKGROUND

In a current gate first high-k/metal gate (HKMG) integration process the gate electrode stack is fabricated by forming a high-k dielectric layer and work function layer on a substrate, followed by forming a layer of polycrystalline silicon (poly Si) on the work function layer. As illustrated in FIG. 1, gate 103 is formed by depositing high-k dielectric layer 105 on substrate 101, followed by forming work function layer 107 on high-k dielectric layer 105. Work function layers commonly include tantalum (Ta), tungsten (W), titanium nitride (TiN), or tantalum nitride (TaN). Poly Si layer 109 is then formed on work function layer 107, followed by patterning and etching spacers 111 on opposite sides of gate 103, and formation of source/drain regions 113. However, during the poly Si deposition and subsequent anneals, a thin dielectric interface 115 containing silicon nitride ($Si_3N_4$) and/or silicon dioxide ($SiO_2$) is formed between work function layer 107 and poly Si layer 109, produced by the reaction of silicon (Si) and nitrogen and/or oxygen present on the surface of the work function layer, for example, on the surface of TiN. This specific metal/Si dielectric interface is the only metal semiconductor/interface that does not become silicided during processing. It prevents stable, reproducible and low-resistance interface connections, resulting in a poor high-frequency device performance. Although the metal/Si dielectric interface might be avoided in a replacement gate process, in a gate first technology this problem has not been solved.

A need therefore exists for methodology enabling a gate first HKMG stack integration without the possibility of formation of the metal/Si dielectric interface.

SUMMARY

An aspect of the present disclosure is a method of fabricating a high-k/metal gate semiconductor device by forming a silicide layer between the work function and poly Si layer.

Another aspect of the present disclosure is a high-k/metal gate semiconductor device including a silicide layer between the work function layer and poly Si layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a high-k/metal gate stack by: forming a high-k dielectric layer on a substrate; forming a work function metal layer on the high-k dielectric layer; forming a silicide on the work function metal layer; and forming a poly Si layer on the silicide.

Aspects of the present disclosure include forming the silicide by forming a reactive metal layer in situ on the work function metal layer; forming an amorphous silicon (a-Si) layer in situ on the entire upper surface of the reactive metal layer; and annealing concurrently with forming the poly Si layer. Further aspects include forming the work function metal layer including TiN. Other aspects include forming the reactive metal layer to a thickness of 1 nm to 3 nm. Another aspect includes forming the reactive metal layer including titanium (Ti). Additional aspects include forming the reactive metal layer by physical vapor deposition (PVD) including flash evaporation. Further aspects include forming the a-Si layer to a thickness of 5 nm to 10 nm. Other aspects include forming the a-Si layer by PVD. Additional aspects include surface cleaning the a-Si layer prior to forming the poly Si layer. Another aspect includes surface cleaning the a-Si layer using hydrogen fluoride (HF). Further aspects include surface cleaning the a-Si layer using HF within no more than 8 hours after forming the a-Si layer. Other aspects include forming the poly Si layer by low-pressure chemical vapor deposition (LPCVD) at a temperature greater than 550° C. Additional aspects include forming the poly Si layer to a thickness of 10 nm to 200 nm. Further aspect include forming a high-k/metal gate by patterning and etching the high-k/metal gate stack; and forming source/drain regions on opposite sides of the high-k/metal gate.

Another aspect of the present disclosure is a device including a substrate; a gate electrode stack formed on the substrate, the gate electrode stack including: a high-k dielectric layer formed on the substrate, a work function metal layer formed on the high-k dielectric layer, a silicide layer formed on the work function metal layer; an a-Si layer formed on the silicide layer and covering the entire upper surface of the silicide layer, and a poly Si layer formed on the a-Si layer; and source/drain regions formed on opposite sides of the gate electrode stack.

Aspects include a device, wherein the work function layer includes TiN. Further aspects include a device, wherein the silicide includes titanium silicide (TiSi). Other aspects include a device, wherein the silicide has a thickness of 0.5 nm to 3 nm. Another aspect includes a device, wherein the a-Si layer has a thickness of 5 nm to 10 nm. An additional aspect includes a device, wherein the poly Si layer has a thickness of 15 nm to 210 nm.

Another aspect of the present disclosure is a method including: forming a high-k/metal gate stack by: forming a high-k dielectric layer on a substrate, forming a work function metal layer including TiN to a thickness of 0.5 nm to 10 nm on the high-k dielectric layer, forming a reactive metal layer including Ti in situ by PVD including flash evaporation to a thickness of 1 nm to 3 nm on the work function metal layer, forming an a-Si layer in situ by PVD to a thickness of 5 nm to 10 nm on the entire upper surface of the reactive metal layer, surface cleaning the a-Si layer using HF within no more than 8 hours after forming the a-Si layer, and forming a poly Si layer by LPCVD at a temperature of greater than 550° C. to a thickness of 15 nm to 200 nm on the a-Si layer; forming a high-k/metal gate by patterning and etching the high-k/metal gate stack; and forming source/drain regions on opposite sides of the high-k/metal gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of formation of a metal/Si dielectric interface attendant upon a gate first HKMG integration process. The metal/Si dielectric interface, containing $Si_3N_4$ and/or $SiO_2$, which causes unstable and high-resistance interface connections resulting in poor high-frequency device performance. In accordance with embodiments of the present disclosure, a silicide is formed between the metal work function layer and the poly Si layer. To form the silicide a reactive metal layer is formed on the work function layer, followed by an a-Si layer. Then the high temperature required for the next step of poly Si deposition produces a silicide from the reaction of the reactive metal and the a-Si.

Methodology in accordance with embodiments of the present disclosure includes forming a high-k metal gate stack by forming a high-k dielectric layer on a substrate, forming a work function layer on the high-k dielectric layer, forming a silicide on the work function metal layer, and forming a poly Si layer on the silicide.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
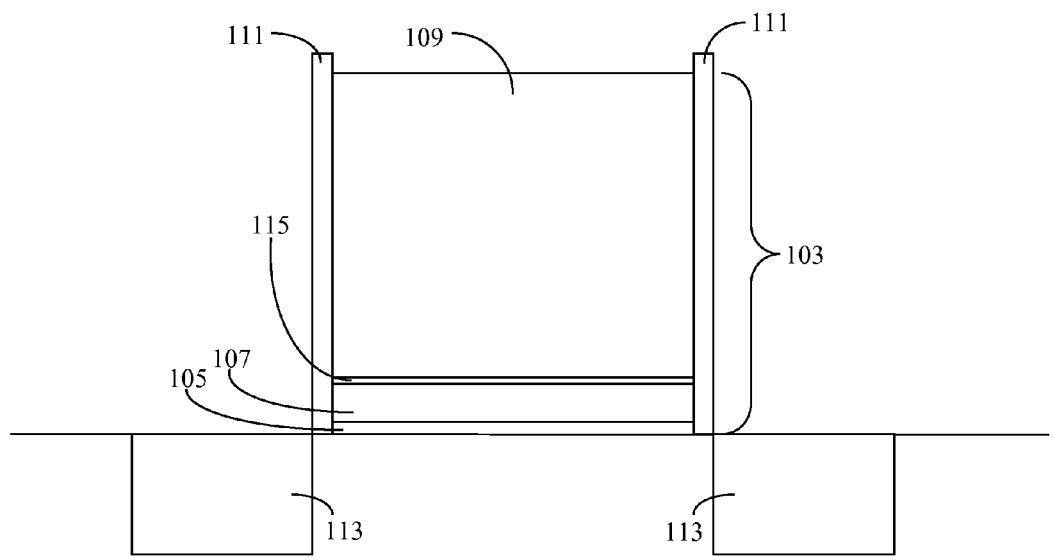
FIG. 1 schematically illustrates a current gate first high-k/metal gate semiconductor device.
Figure 2A:
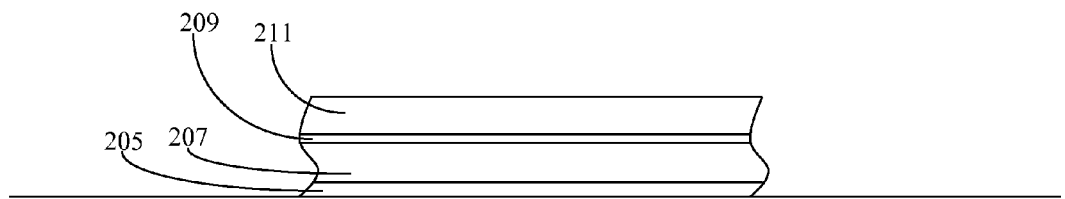
FIGS. 2A through 2C schematically illustrate a process now for a gate first high-k/metal gate semiconductor device, in accordance with an exemplary embodiment.
Figure 2B:
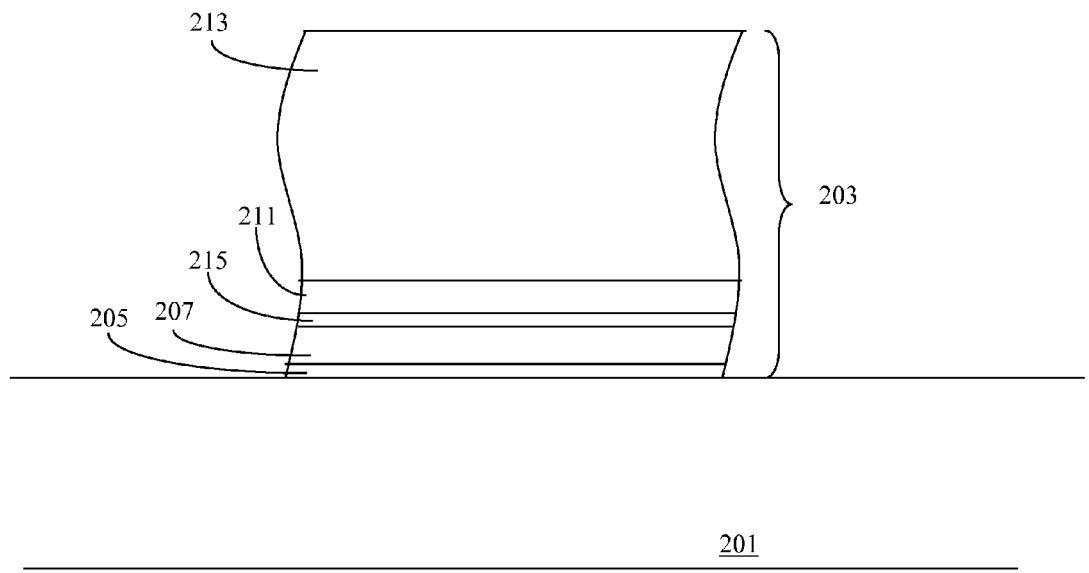
Figure 2C:
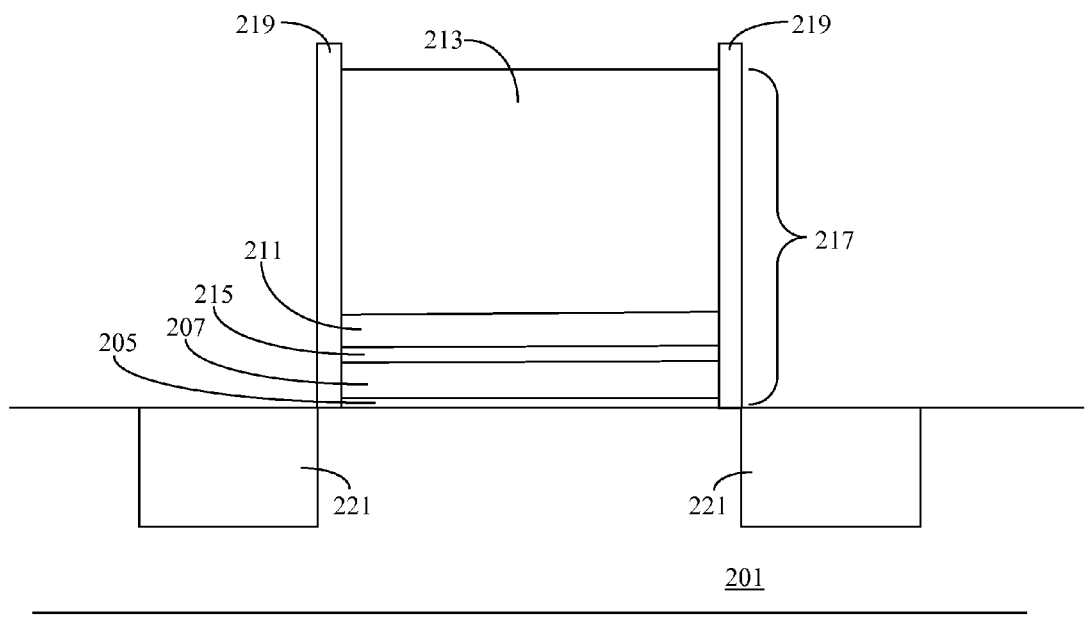

FIGS. 2A through 2C schematically illustrate a process flow for a gate first HKMG semiconductor device, in accordance with an exemplary embodiment. Adverting to FIG. 2A, to form high-k/metal gate stack on a substrate 201, high-k dielectric layer 205 is formed by conventional methods to a thickness of 0.05 nm to 0.50 nm. High-k dielectric layer may include, for example, hafnium (Hf), zirconium (Zr), or Ti oxides. Work function layer 207 is then formed by conventional methods on high-k dielectric layer 205. Work function layer 207 may include, for example, TiN, and is formed to a thickness of 0.2 nm to 10 nm. Reactive metal layer 209, which may include Ti, is formed in situ by a soft sputter process to a thickness of 1 nm to 3 nm on work function layer 207, for example by PVD, e.g., PVD including flash evaporation. Following reactive layer deposition, an a-Si layer 211 is formed in situ on the entire upper surface of reactive metal layer 209. A-Si layer 211 may be deposited for example by PVD, to a thickness of 5 nm to 10 nm, e.g. 10 nm. The a-Si must cover the metal layer completely to prevent oxygen from contacting the Ti or TiN. A-Si layer 211 is then surface cleaned using, for example, HF, within no more than 8 hours after its formation.

Adverting to FIG. 2B, poly Si layer 213 is formed on a-Si layer 211 by LPCVD at a temperature greater than 550° C. Poly Si layer 213 is formed to a thickness of 15 nm to 210 nm. The high temperature required for formation of poly Si layer 213 causes silicidation of the metal of the reactive metal layer 209 with Si of a-Si layer 211. Due to the small amount of metal, i.e. Ti, in reactive metal layer 209, growth of TiSi is limited. The created silicide layer 215 has a thickness of 0.5 nm to 3 nm and is characterized by high homogenousness. Additionally, Ti from reactive metal layer 209 reacts with excess nitrogen in work function layer 207 forming TiN, which is added to work function layer 207.

As illustrated in FIG. 2C, gate stack 203 is patterned and etched, whereby gate 217 is produced. Spacers 219 and source/drain regions 221 may then formed on opposite sides of gate 217, by conventional methods.

The embodiments of the present disclosure can achieve several technical effects, including formation of a stable, low-resistance metal/Si interface within HKMG stack in a gate first technology, rather than a dielectric metal/Si interface, and prevention of abnormal poly Si growth on blank work function metal during LPCVD. The present disclosure enjoys industrial applicability in any of gate first HKMG semiconductor technologies, including 32 nm and 28 nm technology nodes, and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a high-k/metal gate stack by:
   forming a high-k dielectric layer on a substrate;
   forming a work function metal layer on the high-k dielectric layer;
   forming a reactive metal layer in situ on the work function metal layer;
   forming an amorphous silicon (a-Si) layer in situ on the entire upper surface of the reactive metal layer; and
   forming a polycrystalline silicon (poly Si) layer on the a-Si layer, and concurrently annealing to form a silicide between the reactive metal layer and the a-Si layer.

2. The method according to claim 1, comprising forming the work function metal layer including titanium nitride (TiN).

3. The method according to claim 2, comprising forming the reactive metal layer to a thickness of 1 nanometer (nm) to 3 nm.

4. The method according to claim 3, comprising forming the reactive metal layer including titanium (Ti).

5. The method according to claim 4, comprising forming the reactive metal layer by physical vapor deposition (PVD) including flash evaporation.

6. The method according to claim 5, comprising forming the a-Si layer to a thickness of 5 nm to 10 nm.

7. The method according to claim 6, comprising forming the a-Si layer by PVD.

8. The method according to claim 7, further comprising surface cleaning the a-Si layer prior to forming the poly Si layer.

9. The method according to claim 8, comprising surface cleaning the a-Si layer using hydrogen fluoride (HF).

10. The method according to claim 9, comprising surface cleaning the a-Si layer using HF within no more than 8 hours after forming the a-Si layer.

11. The method according to claim 10, comprising forming the poly Si layer by low-pressure chemical vapor deposition (LPCVD) at a temperature greater than 550° C.

12. The method according to claim 11 comprising forming the poly Si layer to a thickness of 15 nm to 200 nm.

13. The method according to claim 1, further comprising:
forming a high-k/metal gate by patterning and etching the high-k/metal gate stack; and
forming source/drain regions on opposite sides of the high-k/metal gate.

14. A device comprising:
a substrate;
a gate electrode stack formed on the substrate, the gate electrode stack comprising:
a high-k dielectric layer formed on the substrate;
a work function metal layer formed on the high-k dielectric layer;
a silicide layer formed on the work function metal layer;
an amorphous silicon (a-Si) layer formed on the silicide layer and covering the entire upper surface of the silicide layer; and
a polycrystalline silicon (poly Si) layer formed on the a-Si layer; and
source/drain regions formed on opposite sides of the gate electrode stack.

15. The device according to claim 14, wherein the work function layer includes titanium nitride (TiN).

16. The device according to claim 15, wherein the silicide comprises titanium silicide (TiSi).

17. The device according to claim 16, wherein the silicide has a thickness of 0.5 nm to 3 nm.

18. The device according to claim 17, wherein the poly Si layer has a thickness of 15 nm to 210 nm.

19. A method comprising:
forming a high-k/metal gate stack by:
forming a high-k dielectric layer on a substrate;
forming a work function metal layer including TiN to a thickness of 0.5 nm to 10 nm on the high-k dielectric layer;
forming a reactive metal layer including Ti in situ by PVD including flash evaporation to a thickness of 1 nm to 3 nm on the work function metal layer;
forming an amorphous silicon (a-Si) layer in situ by PVD to a thickness of 5 nm to 10 nm on the entire upper surface of the reactive metal layer;
surface cleaning the a-Si layer using HF within no more than 8 hours after forming the a-Si layer; and
forming a polycrystalline silicon (poly Si) layer by LPCVD at a temperature greater than 550° C. to a thickness of 15 nm to 200 nm on the a-Si layer;
forming a high-k/metal gate by patterning and etching the high-k/metal gate stack; and
forming source/drain regions on opposite sides of the high-k/metal gate.

* * * * *